(12) United States Patent
Hynynen

(10) Patent No.: US 9,387,515 B2
(45) Date of Patent: Jul. 12, 2016

(54) IMPEDANCE MATCHING FOR ULTRASOUND PHASED ARRAY ELEMENTS

(75) Inventor: Kullervo Hynynen, Toronto (CA)

(73) Assignee: THE BRIGHAM AND WOMEN'S HOSPITAL, INC., Boston, MA (US)

( * ) Notice: Subject to any disclaimer, the term of this patent is extended or adjusted under 35 U.S.C. 154(b) by 1573 days.

(21) Appl. No.: 11/600,301

(22) Filed: Nov. 15, 2006

(65) Prior Publication Data
US 2007/0167764 A1 Jul. 19, 2007

Related U.S. Application Data

(60) Provisional application No. 60/736,713, filed on Nov. 15, 2005.

(51) Int. Cl.
*B06B 1/06* (2006.01)

(52) U.S. Cl.
CPC .................................. *B06B 1/0655* (2013.01)

(58) Field of Classification Search
CPC ...... A61B 8/00; A61B 8/4483; A61B 8/4488; A61B 8/4494
USPC ......... 600/407, 437, 439, 442, 459, 462, 471; 601/2–4; 73/579, 584, 587, 627; 310/311, 313, 322, 350; 367/129, 153, 367/157
See application file for complete search history.

(56) References Cited

U.S. PATENT DOCUMENTS

| | | | |
|---|---|---|---|
| 5,381,067 A * | 1/1995 | Greenstein et al. ........... 310/334 |
| 5,415,175 A * | 5/1995 | Hanafy et al. ................ 600/459 |
| 5,620,479 A * | 4/1997 | Diederich ........................ 601/3 |
| 5,823,962 A * | 10/1998 | Schaetzle et al. ............. 600/439 |
| 5,938,612 A | 8/1999 | Kline-Schoder et al. |
| 6,761,692 B2 | 7/2004 | Angelsen et al. |
| 7,567,016 B2 | 7/2009 | Lu et al. |
| 7,876,027 B2 | 1/2011 | Cochran et al. |
| 2001/0031922 A1* | 10/2001 | Weng et al. ................... 600/439 |
| 2002/0073781 A1 | 6/2002 | Hashimoto et al. |
| 2002/0157472 A1* | 10/2002 | Stephens et al. ................ 73/626 |
| 2003/0107303 A1 | 6/2003 | Mohr, III et al. |
| 2004/0054287 A1* | 3/2004 | Stephens ....................... 600/459 |
| 2004/0267134 A1* | 12/2004 | Hossack et al. ............... 600/459 |
| 2005/0033182 A1* | 2/2005 | Cerofolini .................... 600/459 |
| 2007/0222339 A1 | 9/2007 | Lukacs et al. |

* cited by examiner

*Primary Examiner* — Rochelle Turchen
(74) *Attorney, Agent, or Firm* — Quarles & Brady, LLP

(57) ABSTRACT

A system includes a transducer configured to emit ultrasound in response to receiving an electrical signal from a driving circuit. The transducer includes a first dimension that determines a frequency of the ultrasound and a second dimension that determines an impedance of the transducer. The frequency is independent of the second dimension.

8 Claims, 11 Drawing Sheets

IMPEDANCE MATCHING FOR ULTRASOUND PHASED ARRAY ELEMENTS

CROSS-RELATED APPLICATION

Under 35 U.S.C. 119(e)(1), this application claims the benefit of provisional application Ser. No. 60/736,713, filed Nov. 15, 2005.

TECHNICAL FIELD

This invention relates to therapeutic and diagnostic applications of ultrasound, and more particularly to controlling the electrical impedance of an ultrasonic transducer for use in an ultrasound phased array.

BACKGROUND

A phased array includes an array of ultrasound transducers, each of which produces ultrasound in response to receiving a control signal from radio frequency (RF) driving circuitry. The RF driving circuitry electronically adjust the phase, and amplitude of the ultrasound produces by the transducers so that the phased array can dynamically focus the ultrasound without being moved mechanically. To enable the array to focus the ultrasound in three dimensions, the transducer size should be sufficiently small to provide an ultrasound field that covers the entire volume in which the focusing is desired. Decreasing the size of the transducers, however, increases their electrical impedance, which in turn causes mismatch between the RF driving circuitry and the transducers. Conventional methods for reducing impedance mismatch include adding a matching circuit between each transducer and the RF driving circuitry. As the number of elements within an array increases, supplying a matching circuit for each element becomes costly.

Other conventional techniques for improving electrical-impedance matching include assembling the transducer from multiple layers having a combined electrical impedance that matches the impedance of the RF driving circuitry. Manufacturing such transducers can be complicated and costly, and their usefulness for therapeutic application has not been demonstrated.

SUMMARY

In an aspect, the invention features a method for manufacturing a transducer component. The method includes adjusting a first dimension of a piezoelectric component to cause the piezoelectric component to emit sound at the selected frequency; and adjusting a second dimension of the piezoelectric component to affect an impedance of the piezoelectric component.

In another aspect, the invention features a system including a transducer configured to emit ultrasound in response to receiving an electrical signal from a driving circuit. The transducer has a first dimension that determines a frequency of the ultrasound; and a second dimension that determines an impedance of the transducer, wherein the frequency is independent of the second dimension.

In a further aspect, the invention features an ultrasound array including a plurality of transducers each configured to emit ultrasound in response to receiving an electrical signal from a driving circuit. Each of the plurality of transducers has a first dimension that determines a frequency of the ultrasound; and a second dimension that determines an impedance of the transducer, where the frequency is independent of the second dimension. The ultrasound array also includes a substrate attached to the plurality of transducers.

Embodiments may include one or more of the following. The impedance of the transducer may be independent of the first dimension. The transducer may include a piezoelectric cylindrical wall having an inner surface and an outer surface concentric with the inner surface, where the inner surface defines a lumen. The first dimension may depend on a length of the cylindrical wall, and the second dimension may depend on a distance between the inner and outer surfaces. The transducer may also include a first electrode located along the inner surface; a second electrode located along the outer surface; and a loading material (e.g., water, air, silicone, and epoxy) inserted within the lumen, where the loading material affects the impedance of the transducer. A first electrical conductor may be attached to the first electrode; and a second electrical conductor may be attached to the second electrode. Furthermore, the first and second electrical conductors may be configured to transmit the electrical signal from RF-driving circuitry to the first and second electrodes. The piezoelectric cylindrical wall may include multiple portions having different lengths and configured to emit ultrasound having multiple frequencies determined by the different lengths of the multiple portions. The loading material may include a combination of different materials (e.g., air and water). The frequency may range between 50 kHz and 10 MHz The impedance prior to adjusting the first dimension may be substantially equal to the impedance after adjusting the first dimension. Adjusting the first dimension of the transducer may include adjusting a length of the cylindrical wall (e.g., by cutting the cylindrical wall along a cross section); and adjusting the second dimension of the transducer may include adjusting a distance between the inner and outer surfaces. For example, the length of the cylindrical wall may be adjusted after the distance between the inner and outer surfaces has been adjusted. Manufacturing the transducer component may also include forming a first electrode along the inner surface; forming a second electrode along the outer surface; and inserting a loading material within the lumen (e.g., partially filling the lumen with the loading material). The transducer may be mounted on a substrate of an ultrasound phased array.

The transducers of the ultrasound array may be arranged such that their center-to-center spacings are equal to at most one half of a wavelength corresponding to the frequency. The substrate may be planar or have a spherical curvature. The plurality of transducers may be configured to emit first ultrasound radiation having a power level for ablating tissue and second ultrasound radiation having a power level for imaging tissue.

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 1b shows a transducer for use with the ultrasound phased array of FIG. 1a;

FIGS. 2a-2b show a flowchart of a process for fabricating the ultrasound array shown in FIG. 1a.

DETAILED DESCRIPTION

Manufacturing the transducers such that their electrical impedance closely matches the output impedance of RF driving circuitry eliminates the need for additional matching circuitry and reduces impedance mismatch. As used herein, "impedance" refers to electrical impedance unless otherwise indicated.

The invention described herein is directed to an apparatus that includes an ultrasound transducer whose impedance can be fine-tuned during manufacturing. A first physical dimension of the transducer determines its impedance and a second physical dimension of the transducer determines the frequency of the ultrasound emitted by the transducer. Adjusting the first physical dimension has little to no effect on the frequency of the ultrasound and adjusting the second physical dimension has little to no affect on the impedance of the transducer. Thus, the structure of the transducer enables the impedance of the transducer and the frequency of the ultrasound to be controlled independently.

Figure 1A:
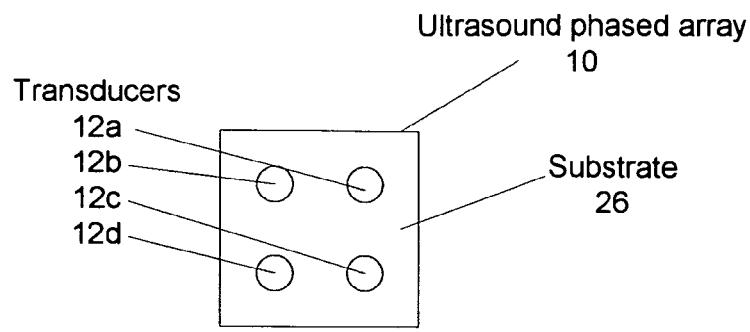
FIG. 1a shows an ultrasound phased array of transducers.

FIG. 1a shows an example of an ultrasound phased array 10 with impedance matching. The phased array 10 includes identical transducers 12a-d that are mounted to a substrate 26, which is typically a plastic, such as plexiglass. Although the array 10 in FIG. 1a is shown to have only four transducers 12a-d, in practice, the array 10 includes more than four transducers. In some embodiments, the array 10 includes over one-thousand transducers. To provide for focusing everywhere in front of the phased array 10, the center-to-center spacing between the transducers is equal to or smaller than one half wavelength of the emitted ultrasound. Larger spacing may be used when the range of focus is limited and/or when the substrate 26 is non-planar. For example, a spherically curved array can have a larger spacing. Any number of transducers could be arranged in any pattern. For example, one arrangement has a thousand transducers arranged in concentric circles in which the horizontal distances and vertical distances between the centers of the transducers are equal to half of the wavelength of the ultrasound. The vertical and horizontal spacing between the centers of the transducers could be equal but different from one half wavelength of the ultrasound, or they could be unequal. Other patterns could include a grid, a spiral, or an irregular pattern, though any pattern is possible. The array 10 could include transducers of the same size, shape, and material composition, or the array 10 could include any combination of transducers of different sizes, shapes, and material compositions. The substrate 26 of the array can be other than planar. For example, the substrate 26 can have a spherical curvature.

In some embodiments, the ultrasound phased array 10 is used for therapeutic applications (e.g., tissue ablation). In other embodiments, the ultrasound phased array 10 is used for diagnostic purposes (e.g., imaging tissue).

Figure 1B:
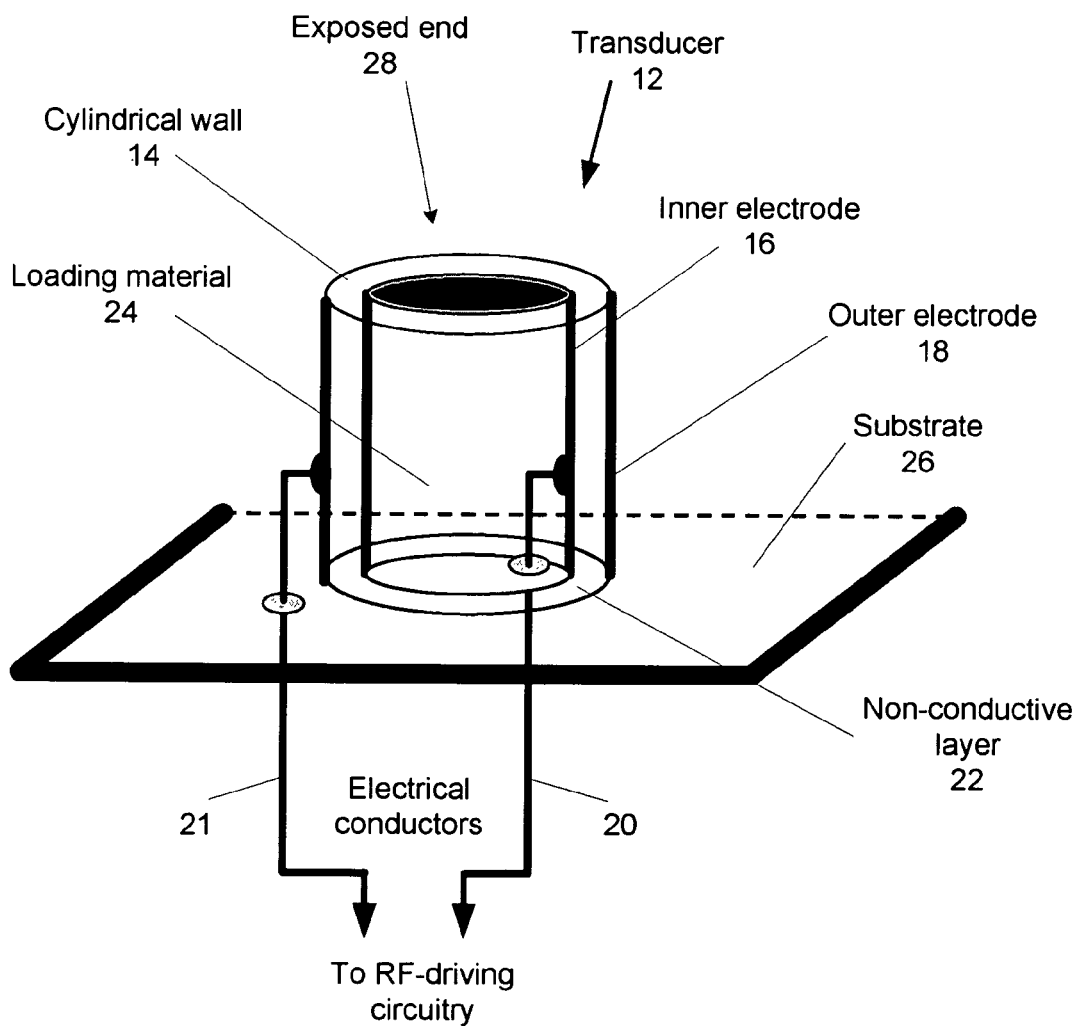

FIG. 1b shows an example of a transducer 12, which could be any of the transducers 12a-d, for use in the ultrasound phased array 10. The transducer 12 is mounted to the substrate 26. The transducer 12 includes a cylindrical wall 14 composed of piezoelectric material. The cylindrical wall 14 includes concentric inner and outer surfaces that together define a hollow cylinder in which the inner surface defines a lumen (i.e., the hollow space within the cylinder). A first conductive material (for example metal) applied along the inner surface of the cylindrical wall 14 forms an inner electrode 16 and a second conductive material (for example metal) applied along the outer surface of the cylindrical wall 14 forms an outer electrode 18. The conductive materials are composed for example of metals or alloys, or conductive epoxies or paints. Examples of electrode metals include copper, nickel, gold, and silver.

Inner and outer conductors (for example wires, or metal foils) 20 and 21 are connected (for example soldered) to the inner and to the outer electrodes 16 and 18, respectively. The conductors 20 and 21 provide electrical connections to RF driving circuitry (not shown). In some embodiments, the conductors 20 and 21 are composed of copper or silver. In some embodiments, the ends of the conductors include connectors that engage the RF driving circuitry.

A non-conductive layer 22 interposed between the cylindrical wall 14 and the substrate 26 provides a low impedance backing on the back end of the transducer and thus reduces wave propagation into the substrate and maximizes the power output from the front end of the transducer 12. In other embodiments, the non-conductive layer 22 provides a high-impedance backing. One example of a non-conductive layer 22 having a low acoustic impedance is a 2 mm thick cork layer. In some embodiments, a layer of glue holds the non-conductive layer 22 to the substrate, and a layer of silicone rubber holds the cylindrical wall 14 to the non-conductive layer 22. In other embodiments the acoustic impedance of the backing material is selected to maximize the wave transmission into the backing to provide a wide-band response (also referred to as a short-pulse response).

A loading material 24 fills the lumen defined by the inner electrode 16. Examples of a loading material 24 include liquids (such as water), gases (such as air), or solids (such as silicone, and epoxy). The loading material 24 can also be a mixture or two or more materials, for example, tungsten powder loaded with epoxy. The loading material 24 may also be controllable during operation. This allows the impedance of the transducer 12 to be changed while the transducer 12 is operating, for example, by configuring the transducer 12 such that a controllable amount of fluid can be pumped into the lumen of the transducer 12 while a portion of the lumen is filled with another fluid. The loading material 24 is selected to adjust the impedance of the ultrasound transducer 12. In some embodiments, the loading material 24 includes a combination of materials, such as air and water. In other embodiments, a membrane such as a polyvinylchloride (PVC) membrane covers the end of the transducer 12 to hold the loading material 24 inside the lumen.

The piezoelectric material of the cylindrical wall 14 is polarized in a direction along the radial axis of the cylindrical wall 14. Examples of piezoelectric materials include piezoceramic materials, such as lead zirconate titanate (PZT), calcium-modified $PbTiO_3$ (PCT), and $SrBi_2Ta_2O_9$ (SBT). In some embodiments, the piezoelectric material is a composite material and/or a material that includes polymers. The cylindrical wall 14 is manufactured by conventional techniques, such as those used by EDO Electro-Ceramic Products of Salt Lake City, Utah, and Valpey-Fisher of Hopkinton, Mass. The cylindrical wall 14 can also be formed by injection molding, using micro machining, or using nanotechnology methods or any other methods.

When driven by the RF circuitry, the transducer 12 produces ultrasound having a frequency that corresponds to the vertical length of the cylindrical wall 14. In particular, the length of the cylindrical wall 14 determines the transducer's natural frequency of vibration. This frequency is referred to as the "length-mode resonant frequency". When driven by an RF signal having a frequency equal to its length-mode resonant frequency, the transducer 12 absorbs more oscillatory energy. This causes it to vibrate with greater amplitude. The vibrations of the transducer 12 form an ultrasound wave that propagates from its exposed end 28.

The surface area of the inner and the outer electrodes 16 and 18, the thickness of the cylindrical wall 14, and the loading material 24, determine the impedance of the transducer 12. For a given loading material 24, the impedance of the transducer is directly proportional to the wall thickness and inversely proportional to the electrode surface area. The cylindrical design of the transducer 12 increases the surface area of the inner and the outer electrodes 16 and 18 and reduces the wall thickness to provide overall reduced impedance. The thickness of the cylindrical wall 14 can be modified without changing its length. Therefore, adjusting the wall thickness controls the electrical impedance of the transducer 12 without substantially affecting the frequency of the ultrasound generated by the transducer 12.

The length of the cylindrical wall 14 ranges between approximately 0.2 mm to 30 mm; the outer diameter of the cylindrical wall 14 ranges between approximately 0.075 mm and 20 mm; and the thickness of the cylindrical wall ranges between approximately 0.001 mm and 5 mm. The transducer 12 can produce ultrasound having a frequency that ranges between approximately 50 kHz and 10 MHz. In some embodiments, the frequency of the ultrasound produced by transducer 12 is greater than 10 MHz. The impedance of the transducer 12 can be adjusted to match the impedance of the RF driving circuitry, which is typically a standard 50 ohms or 100 ohms.

Figure 2A:
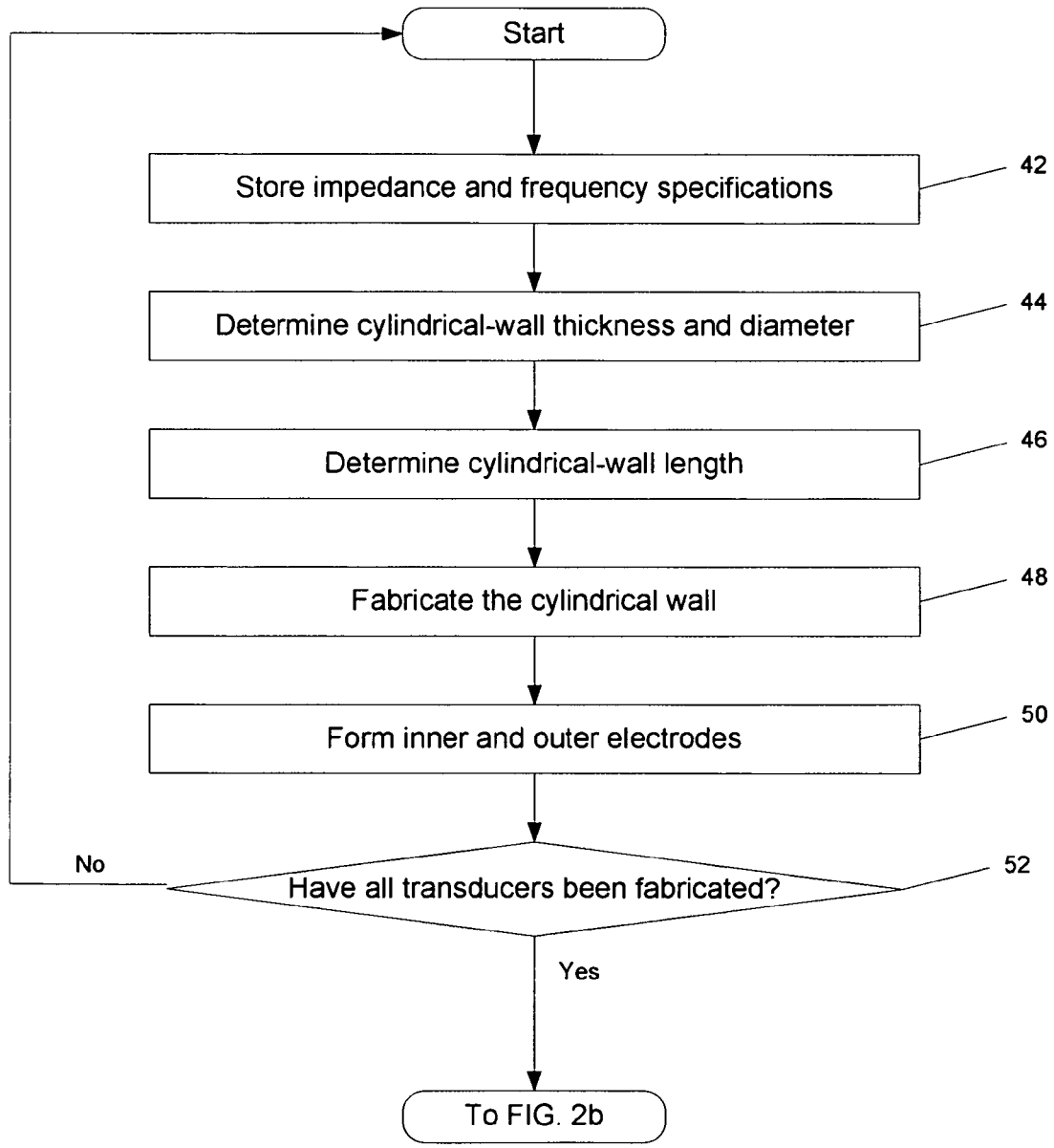
Figure 2B:
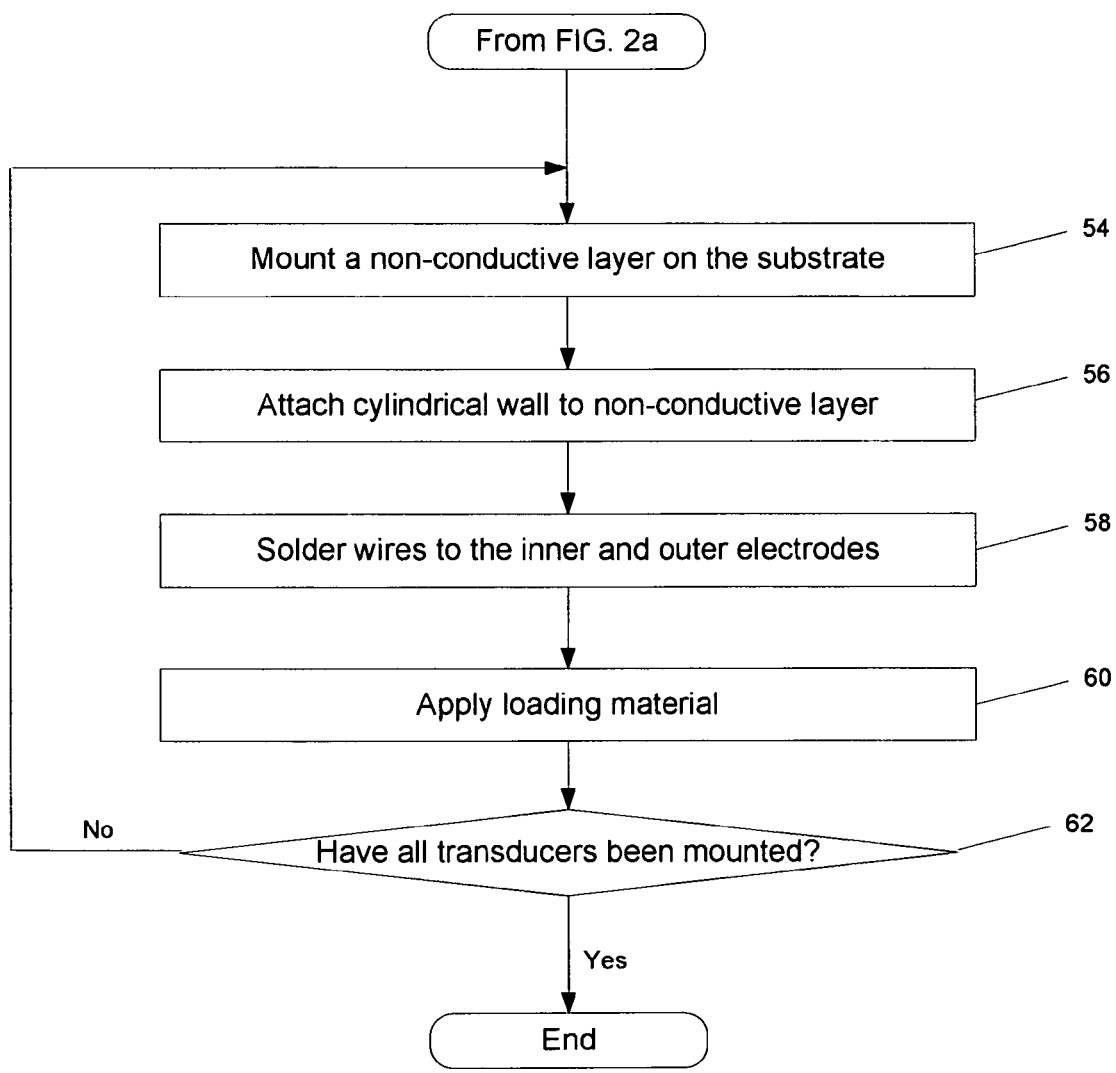

FIGS. 2a-2b show a process 40 for constructing the ultrasound array 10 shown in FIG. 1a. The impedance and frequency specifications of each transducer 12 in the ultrasound array 10 are determined and stored, for example, in a computer (step 42). From the impedance specification, the thickness and outer diameter of the cylindrical wall 14 is determined (step 44). In some embodiments, the thickness and outer diameter are determined using a processor that calculates these dimensions using one or more mathematical equations. In other embodiments, the thickness and diameter are determined from a lookup table, stored in memory, whose entries contain thickness and outer diameter values corresponding to impedances. From the frequency specification, the length of the cylindrical wall is determined (step 46). In some embodiments, a processor calculates the length using one or more mathematical equations. In other embodiments, a processor retrieves the length from a lookup table, stored in memory, whose entries contain lengths corresponding to frequencies. The values stored in the lookup table may be obtained empirically or by calculation.

The cylindrical wall 14 is then fabricated to have the determined outer diameter, wall thickness, and length (step 48). In some embodiments, the cylindrical wall 14 is first constructed according to the thickness and diameter specifications and then cut to a desired length using, for example, a diamond wire saw. The inner and outer electrodes 16 and 18 are formed as metal coatings on the respective inner and outer surfaces of the cylindrical wall 14 (step 50). In some embodiments, steps 48 and 50 are performed in reverse order (i.e., the top and bottom surfaces of a rectangular sheet of piezoelectric material are coated with metal and then the sheet is curled to form the cylindrical wall 14 with the inner and outer electrodes 16 and 18 already attached). If more transducers need to be fabricated (step 52), the steps 42, 44, 46, 48, and 50 are repeated. Otherwise, the transducers are mounted one-by-one onto the substrate 26. The non-conductive layer 22 is mounted on the substrate (step 54). In some embodiments, the non-conductive layer 22 is glued to the substrate. The cylindrical wall 14 is attached to the non-conductive layer 22 (step 56). In some embodiments, the cylindrical wall 14 is mounted on the non-conductive layer 22 with a layer of silicone rubber. The wires 20 and 21 are soldered onto the inner and outer electrodes 16 and 18 to provide electrical connections to RF circuitry (step 58). The lumen defined by the inner electrode 16 is filled with a loading material 24 (step 60) selected to adjust the impedance of the ultrasound transducer 12. In some embodiments, the loading material 24 is chosen from a group consisting of water, air, silicone, and epoxy. In some embodiments, a thin membrane is attached at the end of the cylindrical wall 14 to provide air loading in and around the transducer 12. In other embodiments, the loading material 24 is a combination of materials (e.g., air and water). In further embodiments, the loading material 24 only partially fills the lumen defined by the inner electrode 16. After the transducer 12 has been mounted, a determination is made as to whether all of the transducers have been mounted to the phased array 10. If there are transducers remaining, the process 40 repeats steps 54, 56, 58, and 60 until all of the transducers are mounted.

The steps of the process 40 are not limited to the sequence shown and could be performed in other sequences. For example, a transducer 12 could be fabricated (steps 42, 44, 46, 48, and 50) and then immediately mounted to the phased array 11 (steps 54, 56, 58, and 60) before another transducer is fabricated. In some embodiments, multiple transducers are mounted in parallel. In other embodiments the array 11 is constructed by injection molding or by using micro machining or nanotechnology methods.

EXAMPLES

The feasibility of using the transducer 12 and the ultrasound phased array 10 shown in FIG. 1a-1b for therapeutic and diagnostic applications was tested. All of the transducers under test had the same structure as the transducer 12 shown in FIG. 1b. The transducers were driven by RF signals that were produced by a frequency generator (Model DS345 or Wavetek 395, available from Stanford Research Systems of Sunnyvale, Calif.) and amplified with a RF-amplifier (Model 2400L, available from ENI, Inc. of Rochester, N.Y.). The electrical impedance of the transducers was measured using a network analyzer (Hewlett-Packard, Model 4195A).

Figure 3:
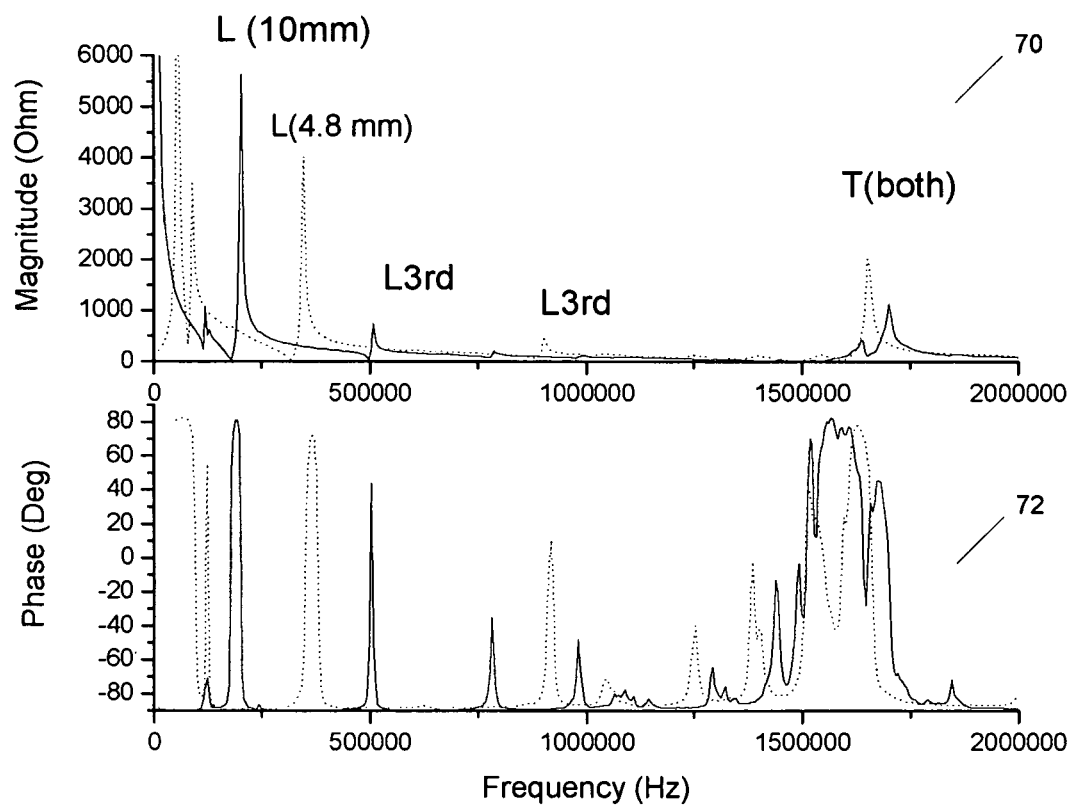
FIGS. 3-4 show plots of the impedance and phase curves of transducers of the type shown in FIG. 1b.

FIG. 3 shows plots 70 and 72 of impedance and phase curves that were measured for two transducers having the same outer diameter (10 mm) and wall-thickness (1.3 mm) but different lengths (4.8 mm and 10 mm). For ease of explanation, the transducer with the length of 4.8 mm will be referred to as "transducer T1" and the transducer with the length of 10 mm will be referred to as "transducer T2". The dotted curve corresponds to transducer T1 and the solid curve corresponds to transducer T2. Both transducers T1 and T2 exhibited a thickness-mode resonant frequency of 1.5 MHz and were loaded with air. The symbol "L" in FIGS. 3-4 denotes the length-mode resonant frequency and the symbol "L3rd" denotes the third harmonic of the length-mode resonant frequency. The plot 72 of the phase curves indicates that the transducer T2 exhibited a fundamental length-mode resonant frequency at approximately 175 kHz and a third harmonic length-mode resonant frequency at approximately 500 kHz and that the transducer T1 exhibited a fundamental length-mode resonant frequency of approximately 350 kHz and a third harmonic length-mode resonant frequency of approximately 900 kHz.

Figure 4:
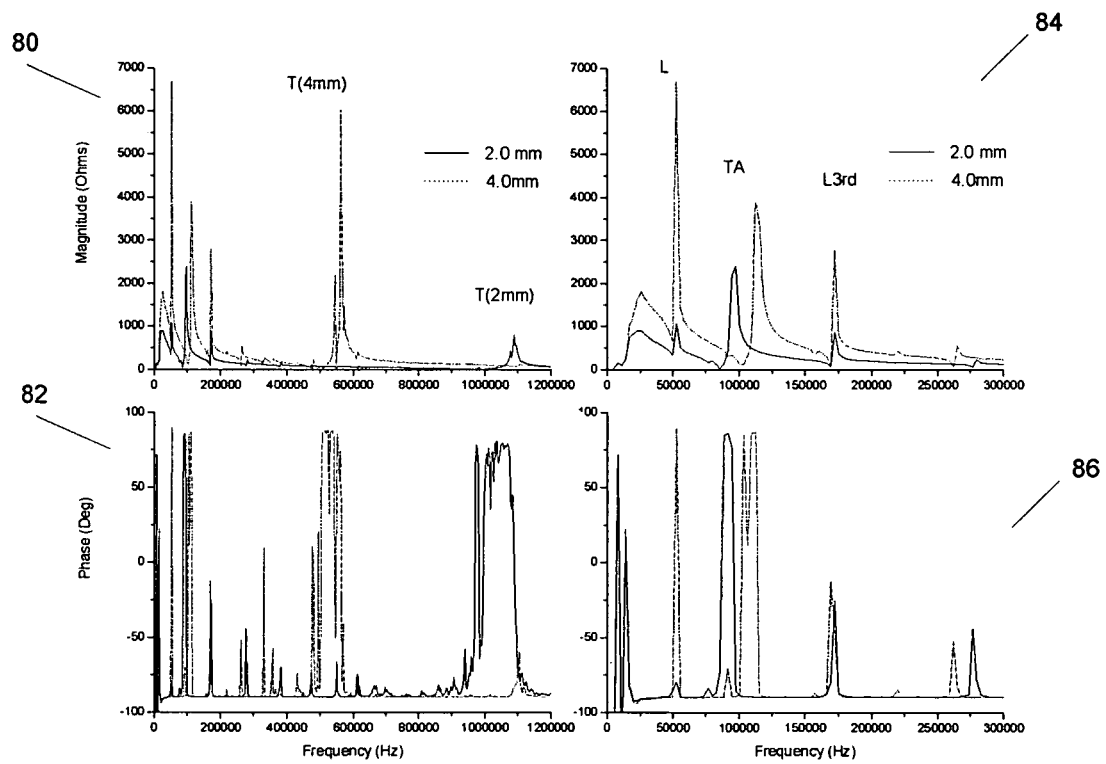

FIG. 4 shows plots 80, 82, 84, and 86 of impedance and phase curves that were measured for two transducers having the same diameters and lengths of 15 mm and 25 mm, respectively, but different cylindrical-wall thicknesses of 4 mm and 2 mm. For ease of explanation, the transducer having the cylindrical-wall thickness of 4 mm is referred to as "transducer T3" and the transducer having the cylindrical-wall thickness of 2 mm is referred to as "transducer T4". A thickness-mode resonant frequency of approximately 0.5 MHz was measured for the transducer T3 while a thickness-mode resonant frequency of approximately 1.0 MHz was measured for the transducer T4. The impedance of the transducer T3 exhibited a minimum impedance of 642 Ohms and the impedance of the transducer T4 exhibited a minimum impedance of 327 Ohms. The transducers T3 and T4 both exhibited a length-mode resonant frequency of approximately 50 kHz. Another, non-overlapping resonant frequency, denoted in FIG. 4 by the symbol "TA", was observed at 100 kHz for the transducer T3 and at approximately 85 kHz for the transducer T4.

Figure 5:
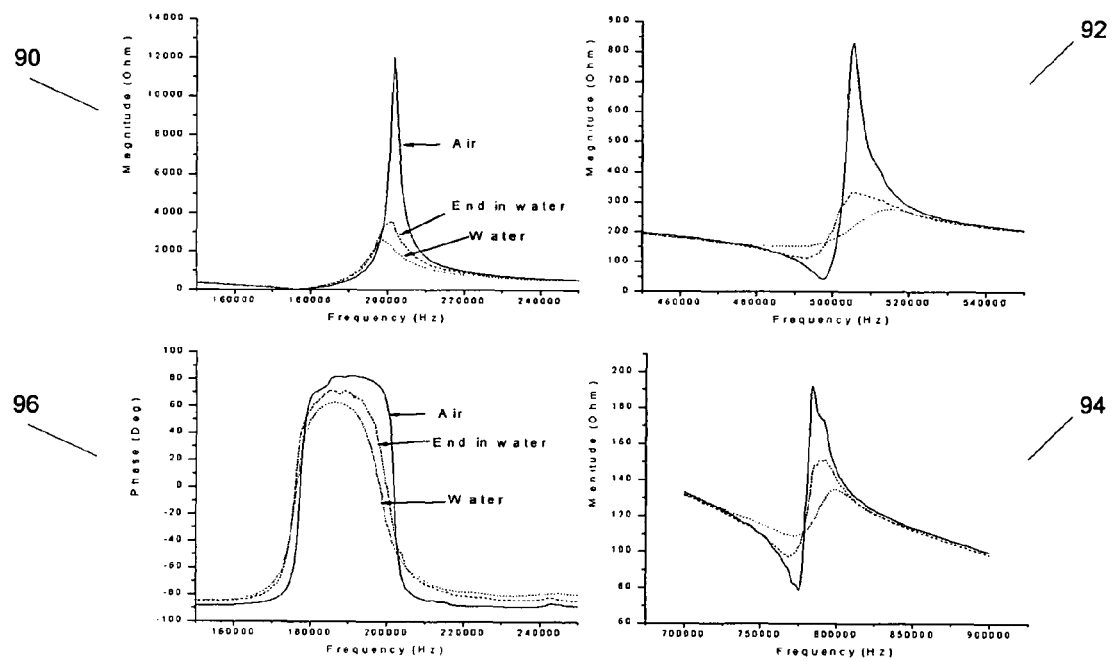
FIG. 5 shows a plot of the impedance and phase curves of transducers of the type shown in FIG. 1b with different loading conditions.

FIG. 5 shows plots 90, 92, 94, and 96 of impedance and phase curves for a transducer having different loading materials (i.e., air, water, and air with the end of the transducer in water). In many of the measurements, a thin PVC membrane (thickness 0.07 mm) was attached at the end of the transducer to provide air loading in and around the cylindrical wall. The impedance curves of plots 90, 92, and 94 indicate that the impedance of the transducer at its length-mode resonance depended on the loading material. According to the phase curves shown in plot 96, the length-mode resonances (i.e., the frequency of the peak phase) varied only slightly depending on the loading condition. Air loading produced the lowest impedance value at the length-mode resonant frequency and the highest peak impedance value. Water loading decreased the magnitude of the peak impedance but had only a small impact on the phase. Air loading with the end of the transducer touching the water produced impedance and phase curves that lay in between the air-loading and water-loading curves.

The outer-diameter dimensions of the transducers, which were on the order of a wavelength of the emitted ultrasound, caused the emitted ultrasound to diverge. Because the emitted ultrasound was measured after it had begun to diverge, the actual conversion-efficiency values of many of the tested transducers were higher than the measured conversion-efficiency values. The measured conversion-efficiency values were determined by dividing the electric power of the RF-driving signal by the acoustic power measured at the output of the transducer.

Figure 6:
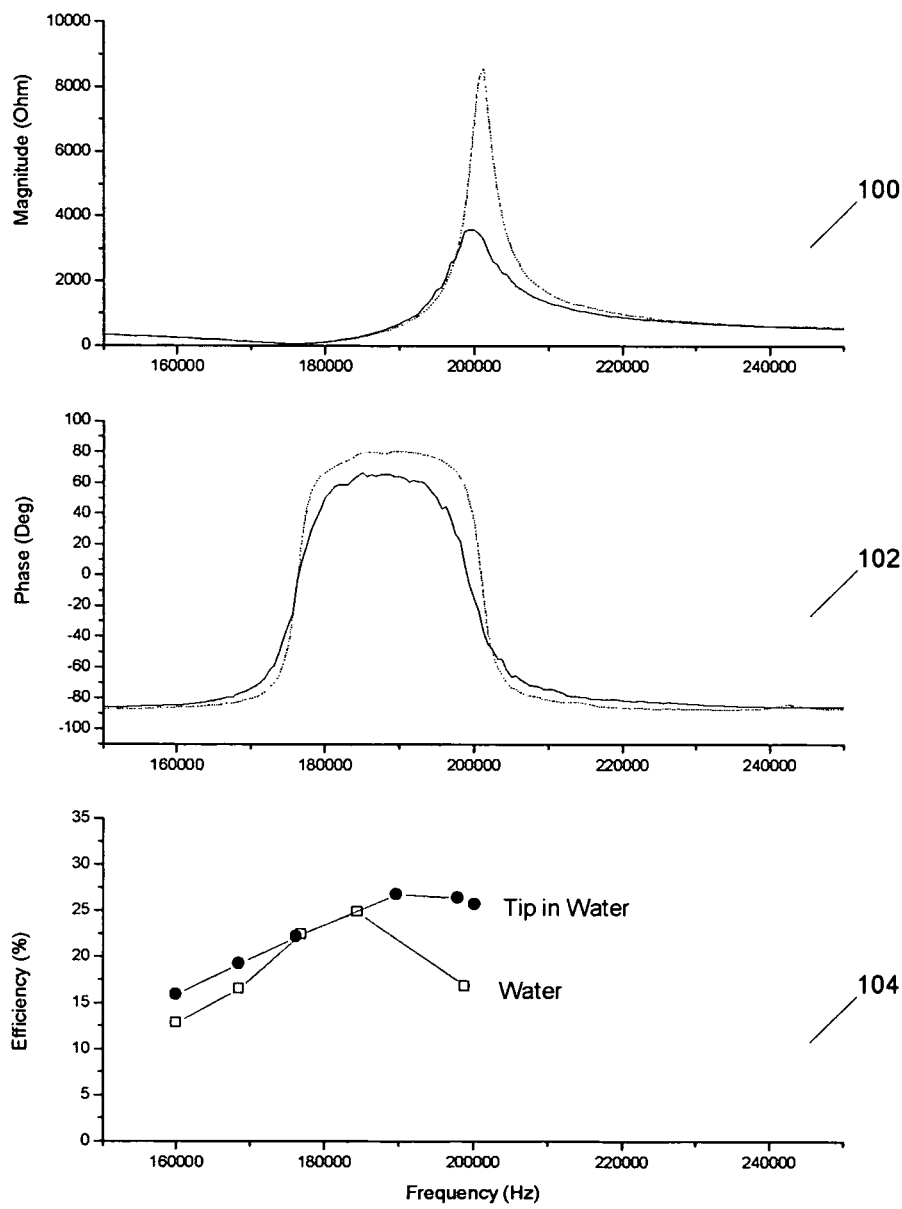
FIG. 6 shows a plot of the impedance, phase, and acoustic output efficiency curves of a transducer of the type shown in FIG. 1b.

FIG. 6 shows a plot 104 of conversion-efficiency curves of the transducer whose impedance and phase curves are shown in the plots 90, 92, 94, and 96 in FIG. 5. The plots 102 and 104, also shown in FIG. 6, show the impedance and phase curves for the transducer when it was loaded with water and when it was loaded with air with its end touching water. These impedance and phase curves are identical to those shown in the plots 90 and 96 for the same loading conditions. According to the conversion-efficiency curves shown in the plot 104, the maximum conversion efficiency of the transducer occurred approximately at the peak phase for both loading conditions. The conversion efficiency was relatively constant between the peak phase and the peak impedance when just the tip of the transducer was touching water, whereas when the transducer was completely filled with water, the acoustic efficiency was reduced at the frequency corresponding to the peak impedance. However, at the minimum impedance value, the conversion efficiency was reduced only approximately 30% from the peak efficiency to the minimum impedance, indicating that the impedance of the transducer 12 can be selected from a wide-range of values without causing the conversion efficiency of the transducer 12 to fall below an adequate level.

To measure the acoustic power and efficiency of a transducer at a selected driving frequency, an external matching network was constructed and tuned for a transducer operating at the selected driving frequency. The matching network was also coupled to RF-power monitoring equipment having a 50-ohm impedance. The RF-power monitoring equipment, which included a dual directional coupler (Model C1737, available from Werlatone) and a digital power meter (Model 438A, available from Helwett-Packard), measured the forward and reflected electric power at the interface between the matching network and the transducer under test. In a radiation-force measurement system, an absorbing target was configured to receive the ultrasound generated from the end of the transducer and measure the acoustic power of the ultrasound.

Figure 7:
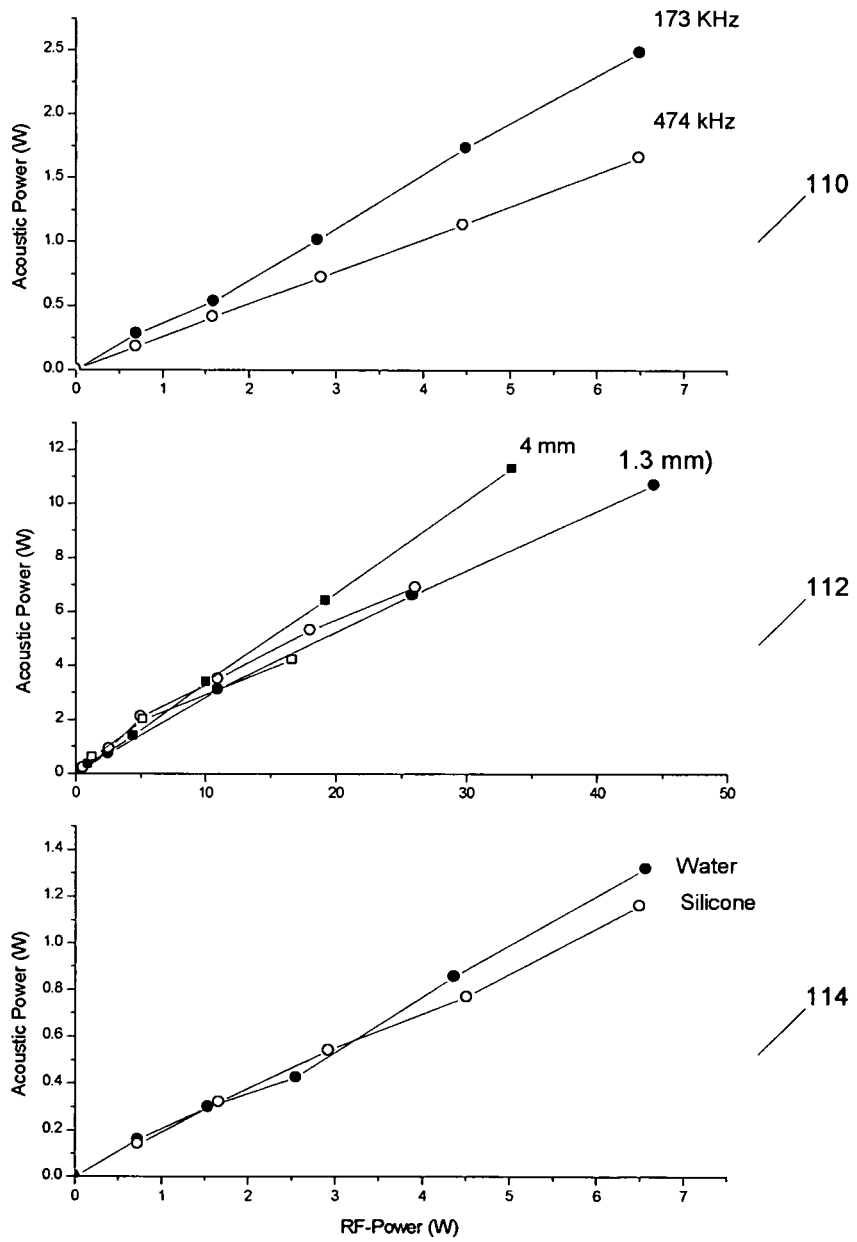
FIG. 7 shows a plot of the acoustic power as a function of the driving radio-frequency (RF) power for a transducer of the type shown in FIG. 1b.

FIG. 7 shows plots 110, 112, and 114 of the acoustic power as a function of the driving RF power for various transducers under test. The plot 110 shows the acoustic-power curve of a transducer when it was driven at its fundamental length-mode resonant frequency (i.e., 173 kHz) and the acoustic-power curve of the same transducer when it was driven at the third harmonic of its length-mode resonant frequency (i.e., 474 kHz). The transducer had a length of 10 mm, an outer diameter of 10 mm, and a wall thickness of 1.3 mm. An approximately linear relationship was observed for each acoustic power curve shown in plot 110.

The plot 112 shows acoustic-power curves that were measured for two transducers having a length of 5 mm, cylindrical-wall widths 1.3 mm and 4 mm, and outer diameters of 10 mm and 15 mm, respectively. For ease of explanation, the transducer having a cylindrical-wall width of 1.3 mm and an outer diameter of 10 mm will be referred to as "transducer T5" and the transducer having a cylindrical-wall width of 4 mm and an outer diameter of 15 mm will be referred to as "transducer T6". The curves with circular markers correspond to the transducer T5 and the curves with square markers correspond to the transducer T6. Curves with different markers correspond to different transducers having wall thicknesses of 1.3 mm. As shown in plot 112, the water-filled transducers exhibited a slightly higher conversion efficiency than the air-filled transducers and provided higher power outputs. The water filled transducers were driven to their limit such that the wire connections to the electrodes were destroyed. A maximum power measurement of 10.7 W and 11.3 W was achieved for transducers T5 and T6 before they failed. The transducers T5 and T6 failed at the locations where the electrodes were connected to the wires. Higher powers may have been achieved if the connections between the electrodes were made more robust.

Plot 114 shows acoustic-power curves that were measured for the transducer T5 when it was filled with water and when it was filled with silicone rubber. A comparison of the two acoustic-power curves shows that using silicone as a loading material did not significantly reduce the efficiency compared to using water as a loading material.

Contour plots of ultrasound fields produced by transducers under test were determined using the following procedure. A needle hydrophone having a spot diameter of 1 mm detected the pressure wave distributions of the ultrasound produced by the transducers under test. Computer-controlled stepper motors moved the hydrophone to predetermined locations that were stored in the computer. At each of the several predetermined locations, the hydrophone measured the pressure wave of the ultrasound emitted from the transducer under test. The hydrophone encoded the pressure wave measurements as electrical signals that were then amplified using an amplifier (available from Precision Acoustics Ltd) and stored by an oscilloscope (model 2431L, available from Tektronix). The oscilloscope measured the amplitudes of the stored pressure waves and the computer stored these amplitude measurements in memory. From the amplitude measurements and their corresponding locations, the computer calculated the ultrasound field generated by the transducer.

Figure 8:
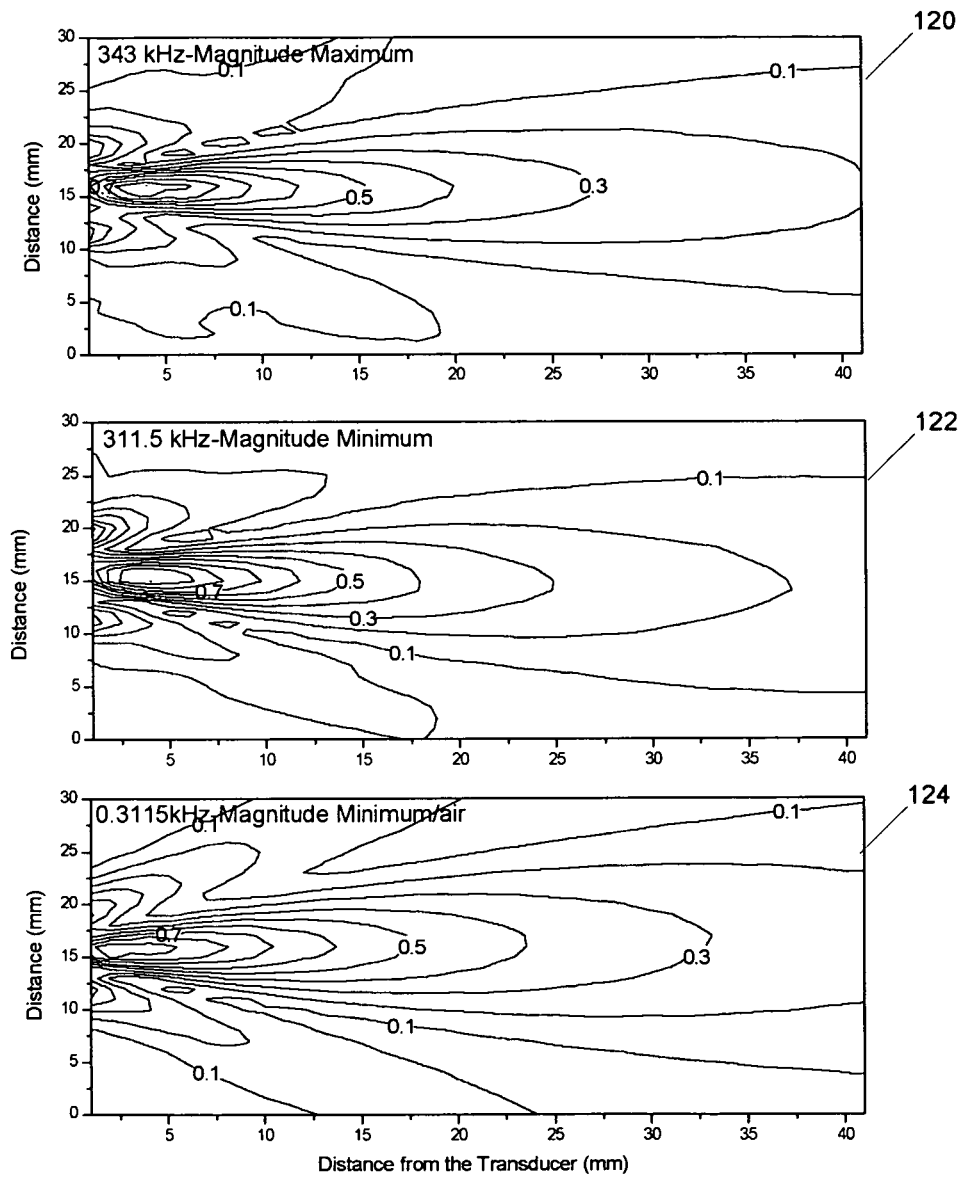
FIGS. 8-9 show contour plots of ultrasound fields produced by transducers of the type shown in FIG. 1b.

FIG. 8 shows contour plots 120, 122, and 124 of ultrasound fields produced by a transducer that was driven with different RF frequencies and subjected to different loading conditions. The transducer had a length of 10 mm, an outer diameter of 6 mm, and a wall thickness of 0.3 mm. The contour plots 120 and 122 show the ultrasound fields produced by the transducer when it was completely filled with water and driven at RF frequencies of 343 kHz and 311.5 kHz, which corresponded, respectively, to the frequencies at which the transducers impedance reached its maximum and minimum values. As expected, the contour plots 120 and 122 show some variation as the frequency increases, but they also indicate that the shape of the ultrasound beam did not depend significantly on the minimum and maximum impedance values. The contour plot 124 shows the ultrasound field that was produced by an air-loaded transducer covered by a PVC membrane, a portion of which was in contact with water. The transducer was driven at an RF frequency of 311.5 kHz, a frequency at which it reached its minimum impedance. As seen in the contour plot 124, the ultrasound field produced by the transducer was slightly more directed than the ultrasound fields shown in the contour plots 120 and 122. Increasing the outer diameter of the transducer also produced a more directed ultrasound field. The ultrasound field directivity decreased when the outer diameter was decreased and approached that of a point source as the outer diameter approached half of a wavelength of the emitted ultrasound.

Figure 9:
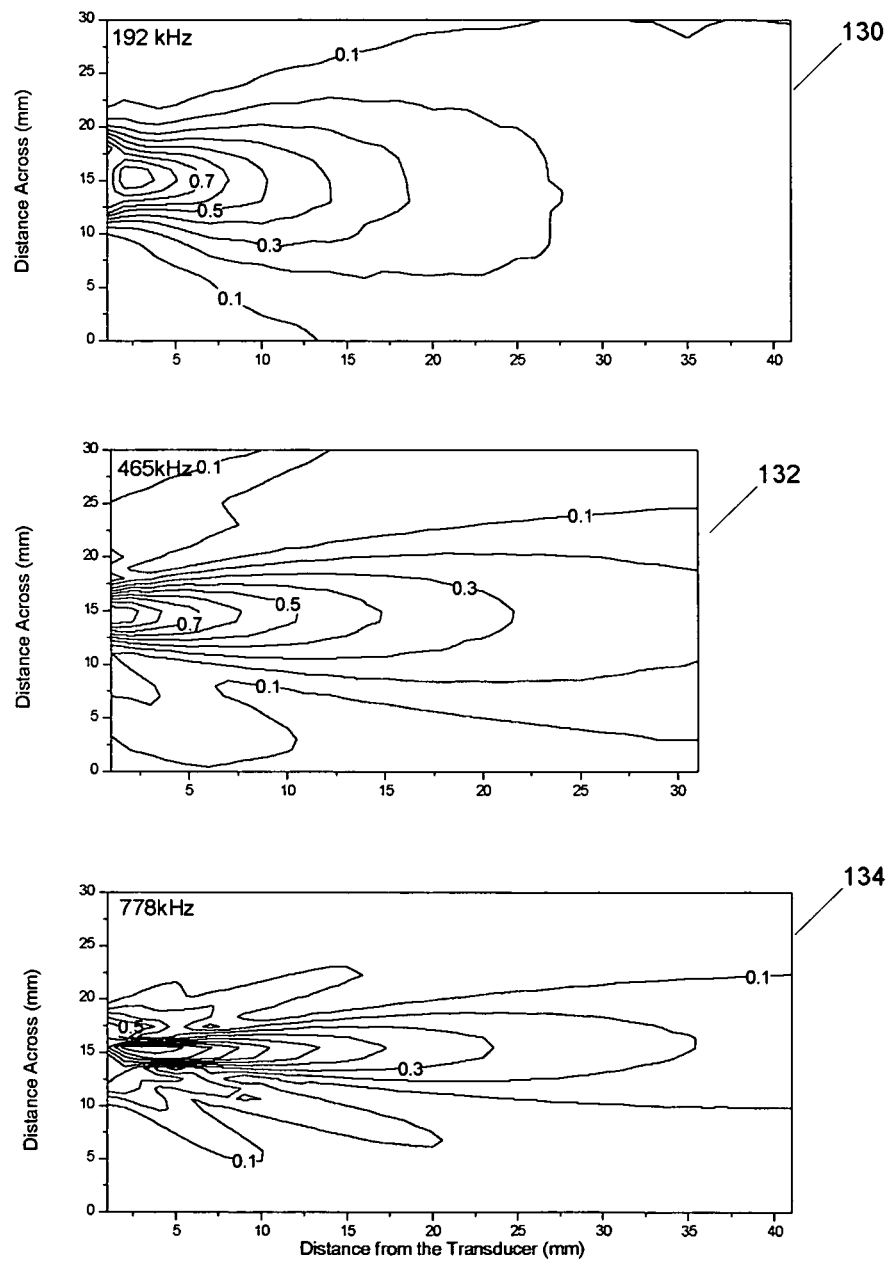

Driving the transducers at higher harmonics also produced ultrasound fields that were more directed than those produced at the fundamental frequencies. FIG. 9 shows contour plots 130, 132, and 134 of the ultrasound fields produced by a transducer having a length of 10 mm, an outer diameter of 6 mm, and a wall thickness of 0.3 mm. A PVC membrane, a portion of which was in contact with water, provided an air surface around the transducer. The contour plot 130 shows the ultrasound field produced by the transducer when it was driven at its fundamental length-mode resonant frequency (i.e., 192 kHz), a frequency at which the transducer reached its minimum impedance. The contour plot 132 shows the ultrasound field produced by the transducer when it was driven at the third harmonic of the length-mode resonant frequency (i.e., 465 kHz). The contour plot 134 shows the ultrasound field produced by the transducer when it was driven at the fifth harmonic of the length-mode resonant frequency (i.e., 778 kHz).

Discussion

The results shown in FIGS. 3-9 demonstrate that it is possible to use length-mode coupling to produce therapeutically useful ultrasound power outputs from ultrasound transducers 12 of the type shown in FIG. 1b. The structure of the transducer 12 allows the transducer impedance to be adjusted to a desired value so that impedance matching can be achieved even with small transducer-dimensions used in phased arrays with full wave control.

The power measurements of the transducers under test translated to a maximum transducer surface intensity of 13.6 W/cm2, a value that is higher than what is currently used for many therapy applications. The length-mode resonant frequencies of the transducers under test were proportional to the lengths of the transducers, and their impedance values were directly proportional to their wall thicknesses and inversely proportional to their electrode surface areas. The transducers produced adequate power as their impedances were adjusted from a minimum value to a maximum value. The loading material also had an impact on the impedance, but had little to no effect on the power output or on the ultrasound field.

One therapeutic application of the phased-array 10 is that of performing low frequency (200-300 kHz) transcranial sonications that are used, for example, to disrupt the blood-brain barrier or to treat thrombolysis. A system designed for this application includes a hemispherical array with a diameter of 25-30 cm. According to the results described in connection with FIGS. 3-9, adequate electronic steering of such an array can be achieved with 10 mm diameter transducers. Transducers having the desired dimensions and output frequency range were produced. Some of these transducers had diameters that were approximately equal to half of the wavelength of the emitted ultrasound. Thus the practicality of a transducer 12 for this particular application was demonstrated.

Other Embodiments

A number of embodiments of the invention have been described. Nevertheless, it will be understood that various modifications may be made without departing from the spirit and scope of the invention. For example, the transducers could be configured to resonate at higher frequencies than the transducers tested in the study.

The lumen of the transducer 12 could be used to provide additional functionality to the array 10. In some embodiments, imaging transducers or hydrophones are placed within the lumen of the transducer 12. In other embodiments, a detector placed within the lumen of the transducer 12 receives diagnostic signals that are emitted by the transducer 12. In further embodiments, a transducer of a multi-frequency array is composed of two or more transducers 12 of different lengths that are arranged concentrically.

In some embodiments, the transducer 12 is part of an intravascular catheter that delivers ultrasound. Such a catheter could be useful for thrombolysis treatment, targeted drug delivery, gene therapy, and other applications. In some of these embodiments, the frequency produced by the transducer 12 is lower than the lowest frequencies that are typically generated by conventional catheters. In some embodiments, the lumen of the transducer 12 includes guide-wires or systems for irrigation and debris removal.

In other embodiments, the cylindrical wall 14 has non-parallel ends thus making the length of the wall uneven. This results in multi-frequency excitation. The transducer 12 could be arranged to include two or more concentric piezoelectric cylinders of the same or different length with inner electrodes and outer electrodes connected together.

Figure 10A:
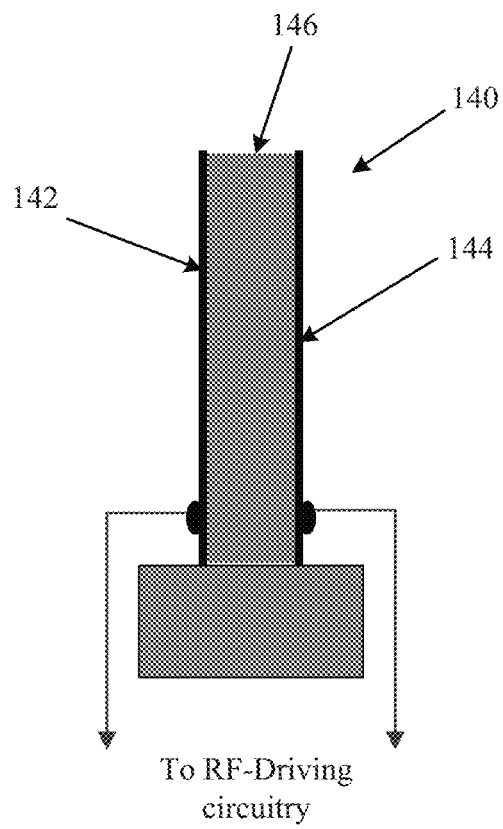
FIGS. 10A and 10B show a transducer with one piezoelectric plate, and a transducer with two parallel piezoelectric plates, respectively.

In further embodiments, the transducer 12 includes: a piezoelectric plate 140 having an inner surface and an outer surface, in which the first dimension of the plate is a length or width of the plate and the second dimension is a thickness of the plate (e.g., a distance between the inner and outer surface). As shown in FIG. 10A, the inner surface of the plate includes a first electrode 142, and the outer surface of the plate includes a second electrode 144. A loading material 146 that affects the impedance of the transducer may be inserted around the plate.

Figure 10B:
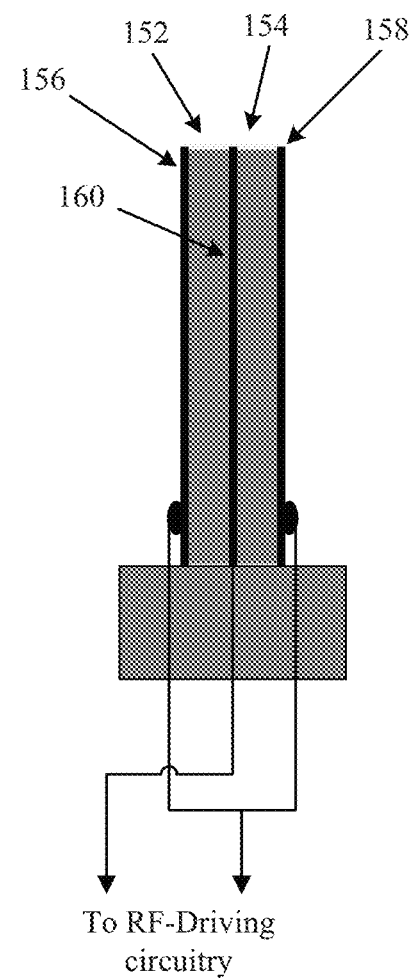

In some embodiments, as shown in FIG. 10B, the transducer 12 includes two or more parallel plates (e.g., plates 152 and 154) of equal size and shape with first and second electrodes (e.g., electrodes 156, 158, and 160) located on the inner and outer surface of each plate. The impedance of the transducer is determined by the thickness and number of the plates and the resonance frequency is determined by the length or width of the plates. The first electrodes of each plate are electrically connected and the second electrodes of each plate are electrically connected. A loading material that affects the impedance of the transducer may be inserted between the plates. The ultrasound is emitted at the end of the plate(s) in a direction parallel with the electrodes. To enable the transducer 12 to be excited at multiple frequencies, a dimension (e.g., length or width) of one or more of the plates is selected to be uneven (i.e., to have different lengths).

In other embodiments, the transducer 12 includes a piezoelectric material with electrodes on surfaces of structures within the transducer 12. The piezoelectric material emits ultrasound in response to receiving a driving signal having a frequency equal to the resonance frequency of the transducer 12. The acoustic impedance of the transducer 12 is determined by thickness and size of the piezoelectric material between the electrodes and the resonance frequency of the transducer 12 is determined by the dimension of the material parallel with the electrodes.

Accordingly, other embodiments are within the scope of the following claims.

What is claimed is:

1. An acoustic transducer array comprising:
  a plurality of transducers;
  a substrate;
  a plurality of conducting electrodes that provide electrical driving signals to the plurality of transducers;
  wherein each of the plurality of transducers comprise cylindrical walls, the cylindrical walls forming each of the plurality of transducers into a cylindrical shape, the cylindrical walls having heights that define the lengths of the transducers, the height defined by a first end thereof and a second end thereof distal from the first end, wherein the first end and the second end are oriented perpendicular to the direction of ultrasound propagation, and further having wall thicknesses, the wall thicknesses defined by a pair of opposing faces that are different from the first end and the second end, wherein the wall thicknesses define the thickness of the transducers, wherein the cylindrical walls further define an interior volume of each such transducer, and wherein each of the plurality of transducers is coupled to the substrate at one of the first end and the second end;
  wherein each transducer is configured to receive an electrical driving signal by way of a pair of conducting electrodes electrically coupled to the respective opposing faces of the transducer, and each transducer is further configured to provide a respective ultrasonic output corresponding to the received electrical driving signal;
  wherein each transducer is configured to emit its respective ultrasonic output from the second end of the transducer and directed away from the transducer;
  wherein each of the plurality of transducers has a length resonance frequency defined by its length; and
  wherein each of the plurality of transducers has an electrical impedance defined by its thickness for a given length.

2. The array of claim 1, wherein the transducers are polarized along a direction parallel to their thicknesses so as to resonate in a length resonance mode at a length resonance frequency defined by their lengths.

3. The array of claim 1, wherein a surface area of the pair of conducting electrodes of the transducer defines an electrical impedance of the transducer.

4. The array of claim 1, wherein each of the plurality of transducers further comprise a loading material disposed within the interior volumes of the transducers.

5. An ultrasonic source, comprising:
  a substrate that supports a transducer;
  wherein the transducer has a first end thereof proximal to the substrate and a second end thereof distal from the substrate, wherein the first and second ends of the transducer define its length;
  wherein the transducer has a thickness orthogonal to its length;
  wherein the transducer includes cylindrical walls, the cylindrical walls forming the transducer into a cylindrical shape, wherein the cylindrical walls further define an interior volume of the transducer, and wherein the transducer is coupled to the substrate at one of the first end and the second end
  wherein the transducer is configured to receive an electrical driving signal by way of a pair of conducting electrodes electrically coupled to respective opposing faces of the transducer, and wherein the transducer is further configured to provide an ultrasonic output corresponding to the received electrical driving signal;
  wherein the transducer is configured to emit its respective ultrasonic output from the second end of the transducer and directed away from the substrate;
  wherein the opposing faces of the transducer are different from the first and second ends of the transducer;
  wherein the transducer has a length resonance frequency defined by its length; and
  wherein the transducer has an electrical impedance defined by its thickness for a given length and further wherein the thickness does not have an effect on the resonance frequency.

6. The array of claim 1, wherein the plurality of transducers are polarized along a direction orthogonal to the direction of wave propagation.

7. The array of claim 1, wherein the plurality of transducers are positioned such that the center-to-center spacing between each of the plurality of transducers is equal to one-half wavelength of the ultrasonic output.

8. The array of claim 1, wherein the plurality of transducers are positioned such that the center-to-center spacing between each of the plurality of transducers is less than one-half wavelength of the ultrasonic output.

* * * * *